United States Patent [19]
Ishii

[11] Patent Number: 5,644,499
[45] Date of Patent: Jul. 1, 1997

[54] RETIMING GATED-CLOCKS AND PRECHARGED CIRCUIT STRUCTURES

[75] Inventor: Alexander T. Ishii, Princeton, N.J.

[73] Assignee: NEC USA, Inc., Princeton, N.J.

[21] Appl. No.: 525,815

[22] Filed: Sep. 7, 1995

Related U.S. Application Data

[63] Continuation of Ser. No. 148,696, Nov. 5, 1993, abandoned.
[51] Int. Cl.$^6$ .................................................. G06F 17/10
[52] U.S. Cl. ........................ 364/489; 364/488; 364/490
[58] Field of Search ................................. 364/488, 489, 364/490, 491

[56] References Cited

PUBLICATIONS

Ishii, Leiserson, and Papaefthymiou, "Optimized Two–Phase, Level–Clocked Circuitry" pp. 245–265.
Lockyear and Ebeling, "Optimal Retiming of Level–Clocked Circuits Using Symmetric Clock Schedules", IEEE Trans. on CAD and ICs, vol. 13 No. 9, Sep. '94, 1097–1109.
Lockyear & Ebeling, "Practical Application of Retiming to the Design of High–Performance Systems", Proceedings of 1993 IEEE/ACM Int'l. Conf on CAD, 288–295.
Papefthymiou & Randall, "TIM: A timing package for Two–Phase, Level–Clocked Circuitry", Proceedings From 30th (1993) ACM/IEEE Design Automation Conf, 497–507.
Szymanski, "Computing Optimal Clock Schedules", Proceedings 29th (1992) ACM/IEEE Des. Auto. Conf. 399–404.
Ishii, "Retiming Gated–Clocks and Precharged Circuit Structures" Proc. 1993 ACM/IEEE Conf. on CAD, 300–307.

*Primary Examiner*—Kevin J. Teska
*Assistant Examiner*—Tyrone V. Walker
*Attorney, Agent, or Firm*—Philip J. Feig

[57] ABSTRACT

A general set of timing constraints, along with methods for computing the "critical" elements of the set, i.e., the elements of the set that, if satisfied, are sufficient to guarantee proper circuit timing, enables retiming of VLSI systems incorporating gated clock signals and/or precharged circuit structures without changing the input/output behavior of the system. In one method, either the clock signal used by a system component is changed or alternatively, a new clock signal is generated for use in the system. In another method, a system component is retimed by retiming other system components. In a further method, multiple critical paths for each pair of components comprising the system are computed. The most critical path for each pair of components is selected and if the most critical path for a pair of components is not properly timed, one component of the pair is retimed in order to properly time the pair of components. If the most critical path is properly timed, or is properly timed after retiming, the procedure is repeated for another pair of components until each pair of components is properly timed so that the VLSI system is, in turn, retimed.

16 Claims, 5 Drawing Sheets

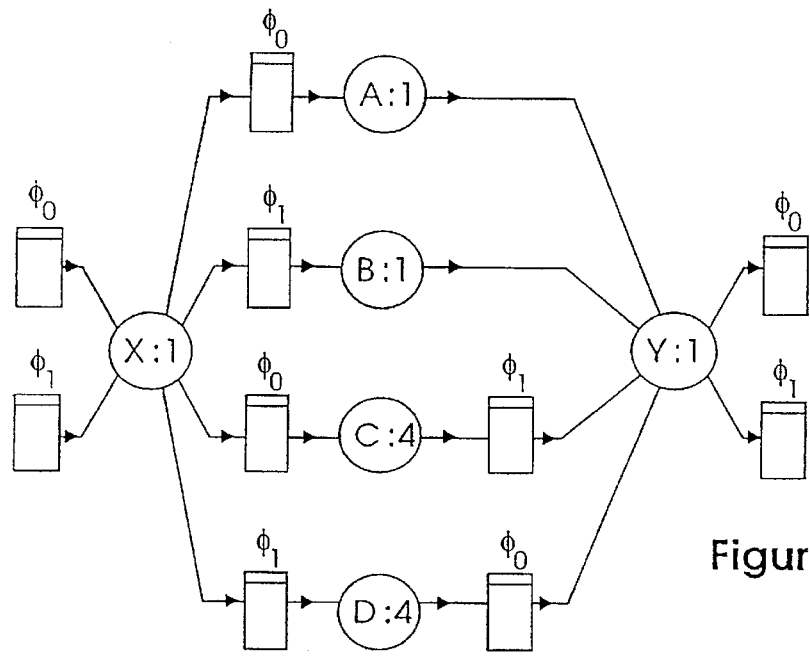
Figure 4a
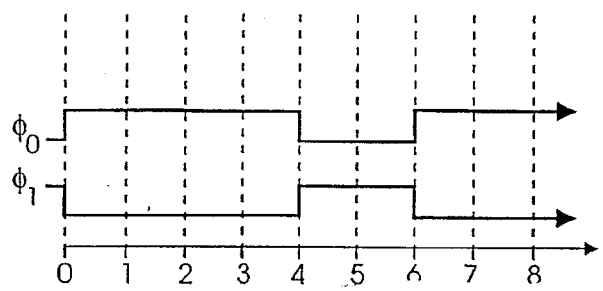
Figure 4b
| | $\phi_0 - \phi_0$ | $\phi_0 - \phi_1$ | $\phi_1 - \phi_0$ | $\phi_1 - \phi_1$ | Init. | r(Y)=1 | r(Y)=1 r(X)=1 | r(X)=1 |
|---|---|---|---|---|---|---|---|---|
| A | 4-3= 1 | 6-3= 3 | 6-3= 3 | 8-3= 5 | 1 | 3 | -1 | -3 |
| B | 10-3= 7 | 6-3= 3 | 6-3= 3 | 2-3= -1 | -1 | 3 | 1 | -3 |
| C | 10-6= 4 | 6-6= 0 | 12-6= 6 | 8-6= 2 | 0 | 4 | 0 | -4 |
| D | 10-6= 4 | 12-6= 6 | 6-6= 0 | 8-6= 2 | 0 | 2 | 0 | -2 |
Figure 4c RETIME (G) $\triangleright G = (V, E, d, \updownarrow\Phi_I, \updownarrow\Phi_O)$;

1   Generate critical constraints.

2   Combine critical constraints with equality constraints and form IMP problem.

3   Test feasibility of IMP problem.

4   Return feasible retiming if one exists.

Figure 5

RETIMING GATED-CLOCKS AND PRECHARGED CIRCUIT STRUCTURES

This is a continuation of application Ser. No. 08/148,696 filed Nov. 5, 1993, now abandoned.

BACKGROUND OF INVENTION

The present invention relates to methods for retiming VLSI systems and specifically VLSI systems which contain precharged circuit structures and/or gated clock signals.

Due to the tangible speed, power, and area benefits of circuit structures that utilize precharging techniques and/or gated clock signals, both are common in high-performance VLSI designs. Prior methods of achieving retiming (i.e. optimizing the placement of latches) have not addressed the peculiarities of precharged circuit structures and gated clock signals and therefore, have not been applicable to many non-ASIC VLSI systems.

The present invention concerns a method which is capable of use with precharged circuit structures and gated clock signals and is applicable to the retiming of "full custom" VLSI designs. While the invention is described in conjunction with retiming, the methods are also applicable to solving the problem of timing verification. That is, the results are based upon a general set of "timing" constraints which is directly applicable to circuits containing precharged circuit structures and gated clock signals.

The fabrication of digital MOS/VLSI designs whose area and power dissipation are as low as possible often results in the use of "precharged" circuit structures and "gated" clock signals. For example, savings in area and power dissipation can frequently be realized by replacing combinational logic blocks with precharged circuit structures, such as domino logic. Savings can also be realized by using combinational logic blocks to selectively prevent clock pulses from reaching particular clocked storage elements. Due to the importance of minimizing area and power dissipation, many full-custom VLSI systems, such as microprocessors, make extensive use of such precharged structures and gated clock signals.

Retiming is the process of optimizing the placement of latches with respect to some performance parameter, generally clock period. Previous retiming techniques are not directly applicable to circuits that utilize gated-clock signals and/or precharged circuit structures because these techniques do not consider the additional timing constraints that such structures impose. This inability to handle gated clocks and precharged circuit structures prevents previous methods for retiming circuits from being applied to a variety of high-performance designs.

SUMMARY OF THE INVENTION

The present invention considers the use of multiple input phases, multiple output phases and multiple temporal lengths when performing retiming. In the prior art only a single (per node) input phase and output phase, and a single (per edge) temporal length are used.

Moreover, the invention relates to the retiming of circuit structures that cannot be strictly classified as either combinatorial logic or latch storage elements. In the prior art, retiming techniques have been limited to circuits whose components were strictly definable into these two element groups.

Additionally, the invention concerns the concept of forcing the retiming of a component c that generates an input i, wherever a lagged version of i cannot be obtained by introducing a single latch at the output of c. Previous retiming methods assume that it is possible to obtain a lagged signal i by placing a latch in the path.

Another aspect of the invention is the concept of lagging a clock-signal input by either specifying that the input be a different available clock signal or alternatively, the input be a newly generated clock signal. Previously, it was presumed that lag was introduced by means of latches and not by directly generating or using other available clock signals for lagged versions of periodic signals, such as clock signals.

A principal object of the present invention is therefore the provision of a method for generalizing previous retiming techniques so that they are directly applicable to circuits with precharged structures and gated clock signals. A general set of timing constraints is described, along with methods for computing the "critical" elements of the set, i.e., the elements of the set that, if satisfied, are sufficient to guarantee proper circuit timing. These critical constraints are used to formulate sets of inequalities that are analogous to those previously used to compute retimings of level-clocked circuits. In addition, the present invention concerns the retiming of circuits containing precharged circuit structures and gated-clock structures, which are not addressed by previous retiming methods.

Further objects of the invention will become more clearly apparent when the following description is read in conjunction with the accompanying drawings.

BRIEF DESCRIPTION OF THE DRAWINGS

FIG. 1b is a schematic diagram of a more efficient implementation of a gated-clock structure which can replace the circuit in FIG. 1a;

FIG. 2b is a timing diagram associated with the circuit shown in FIG. 2a;

FIG. 4a is a schematic diagram of cricital paths for retiming of X and Y;

FIG. 4b is a timing diagram associated with the critical paths shown in FIG. 4a;

FIG. 4c is a table of the paths shown in FIG. 4a; and

FIG. 5 is an algorithm for testing whether a circuit represented by a graph can be retimed.

DETAILED DESCRIPTION OF THE INVENTION

Figure 1A:
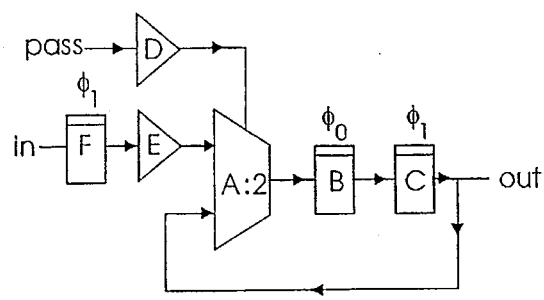
FIG. 1a is a schematic diagram of a circuit structure which can be replaced by a gated-clock structure.
Figure 1B:
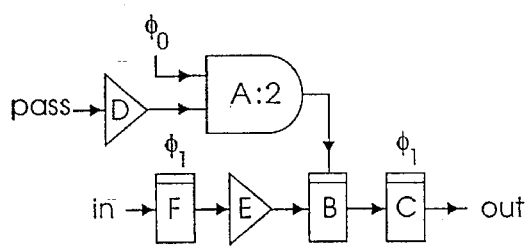
Figure 1C:
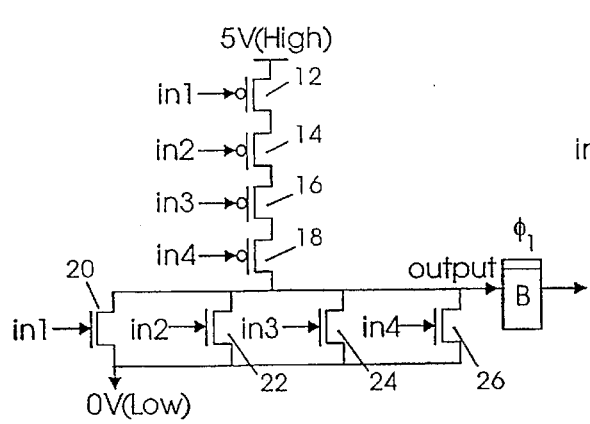
FIG. 1c is a schematic diagram of a fully complementary NOR gate.
Figure 1D:
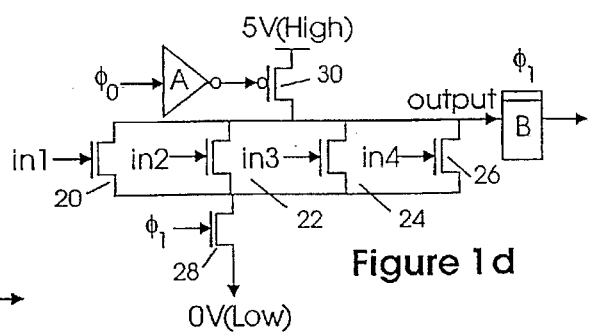
FIG. 1d is a schematic diagram of a precharged implementation of a NOR gate.
Figure 1E:
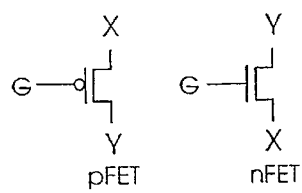
FIG. 1e is a schematic diagram of a pFET and a nFET.
Figure 1F:
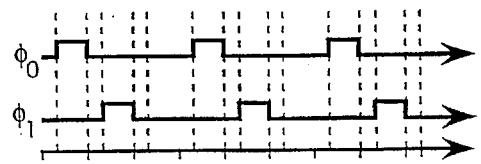
FIG. 1f is a timing diagram of clock signals $\phi_0$ and $\phi_1$.

Referring now to the figures and to FIGS. 1(a) to 1(d) in particular, there is shown in FIG. 1(a) a circuit structure which can be replaced by a gated-clock structure. FIG. 1(b) shows a gated-clock structure which can replace the circuit in FIG. 1(a). FIG. 1(c) shows a fully complementary NOR gate and FIG. 1(d) shows a precharged implementation of a NOR gate.

The advantages and disadvantages of the circuits shown in FIG. 1 include the fact that the circuits in FIGS. 1(a) and 1(b) conceptually compute the same function, yet, the circuit in FIG. 1(b) is in general a more efficient implementation, since it has the benefit of less propagation delay between in and out, and in many cases requires less silicon area to implement. Similarly, the circuits in FIGS. 1(c) and 1(d) conceptually compute the same function, yet the circuit in FIG. 1(d) is generally more efficient, because of the reduced number of pFETs. The circuit shown in FIG. 1(b) is an example of a gated-clock structure, while the circuit shown in FIG. 1(d) is an example of a precharged circuit structure.

In order to understand the benefits of gated-clock structures consider the circuit shown in FIG. 1(a). The functional element A is a multiplexor that sets its output equal to the value output from E when the signal pass is HIGH, and sets its output equal to the value of out when the signal pass is LOW. Assuming that the value of pass can only change while clock $\phi_0$ is LOW, components A, B and C behave (in the aggregate) like a register whenever pass is HIGH, i.e., the value of out is equal to the value output from E at the most recent point in time that clock $\phi_0$ changed value from HIGH to LOW. If pass is LOW, then the value of out is "recirculated" into B, i.e., the value of out remains constant. Behavior similar to that of the circuit shown in FIG. 1(a) can be realized using a circuit such as that shown in FIG. 1(b). Rather than incorporate a multiplexor and a "recirculate" path, the alternative circuit prevents new output values from E from being stored in B, by selectively "blocking" the pulses of clock $\phi_0$ using the signal pass and the AND-gate A. While the hardware needed to implement these two example circuits is roughly comparable, the second gated-clock structure of FIG. 1(b) is more advantageous in the common situation where the output of A can be shared by many different latches. In addition, the gated-clock structure removes propagation delay from the in to the out path, which may also be beneficial.

The pFETs 12, 14, 16, 18 and nFETs 20, 22, 24, 26 in FIG. 1(c) implement a four-input NOR gate, i.e., the output node will be at a LOW voltage if and only if either in1, in2, in3, or in4 is at a HIGH voltage. The illustrated NOR gate is the standard "full complementary" version that is common in many VLSI designs.

Full-complementary gates tend to be relatively expensive in terms of both the area required to implement them and the amount of power needed to operate them. For example, the full-complementary NOR gate shown in FIG. 1(c) consists of four pFETs, and four nFETs. In contrast, the pFET 30 and nFETs 20, 22, 24, 26, 28 shown in FIG. 1(d) conceptually implement the same function, but with three fewer pFETs. The fact that fewer pFETs are employed generally implies that the circuit can be implemented using less silicon area. In addition, since the various terminals of the nFETs and pFgTs are all characterized by nonzero electrical capacitances (which must be charged and discharged each time that the logical voltage on the terminals changes), the circuit in FIG. 1(d) will generally also be "faster" and dissipate less power while operating.

The greater efficiency of precharged circuits comes at the expense of greater complexity in their operation. Unlike full-complementary gates, where the desired logical voltage can be obtained at the output simply by presenting a set of voltages at the inputs, precharged circuits require that a sequence of inputs to be presented. For example, most precharged circuits require a sequence analogous to the following, where it is assumed that the inputs in1 through in4 are at constant values throughout the entire sequence.

The first set of inputs in the sequence must be such that the input $\phi_0$ is at voltage HIGH, while the input $\phi_1$ is at voltage LOW. While the first set of inputs is presented to the circuit, the output of the circuit is "pulled-up" to the voltage HIGH. While the first set of inputs is being presented to the circuit, the circuit is precharging, and the interval of time during which the first set of inputs is presented is the precharge phase.

During the second set of inputs in the sequence, $\phi_0$ is LOW, and $\phi_1$ is HIGH. If the inputs in1 through in4 are LOW, then the electrical capacitance associated with the various circuit components will "hold" output at a HIGH voltage. If any of these inputs is HIGH, then a path will be established between output and LOW. The final value of output is the logical NOR of inputs in1 through in4. While the second set of inputs is being presented to the circuit, the circuit is evaluating, and the interval of time during which the second set of inputs is presented is the evaluation phase.

Figure 2A:
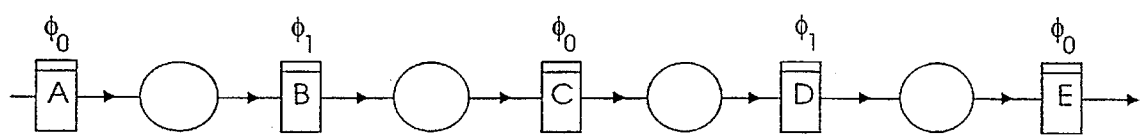
FIG. 2a is a schematic diagram of a level-clocked circuit.
Figure 2B:
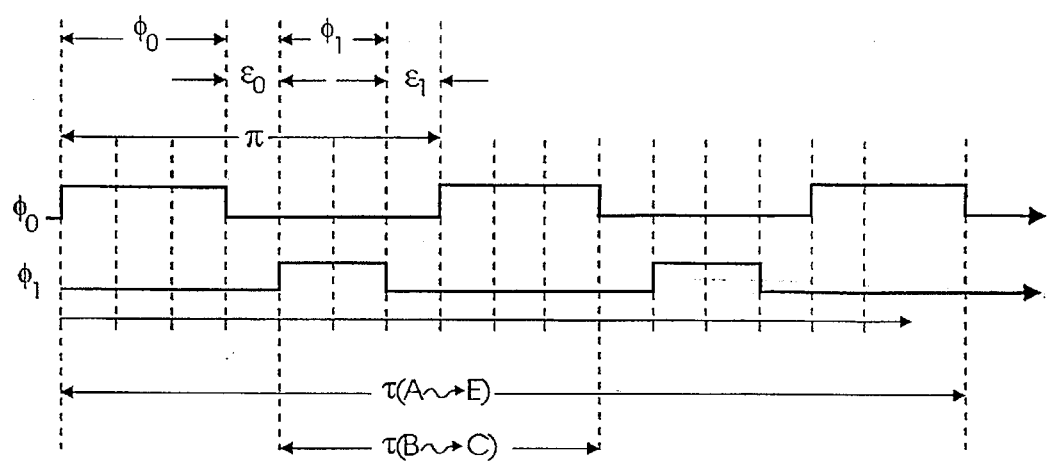

Timing constraints for a simple level-docked circuit (no gated-clock signals or precharged circuit structures) can be be stated as inequalities between the propagation delays along paths in the circuit and the amount of time between the rising edge of some clock pulse and the falling edge of some later clock pulse. For example, the circuit shown in FIG. 2 is not properly timed unless the total propagation delay along the path A→E is less than the amount of time $\tau(A \rightarrow E) = \phi_0 + 2(\epsilon_0 + \phi_1 + \epsilon_1 + \phi_0) = \phi_0 + 2\pi$, where $\phi_0$, $\phi_1$, $\epsilon_0$, $\epsilon_1$ and $\pi$ are "overloaded" to denote the interval lengths indicated in FIG. 2. Similarly, the circuit is not properly timed unless the total delay along the path B→C is less than $\tau(B \rightarrow C) = \phi_1 + \epsilon_1 + \phi_0$. A circuit is defined to be properly operating if and only if whenever a latch holds a value (i.e. whenever its clock input is LOW), it holds the same value it would hold in an identical circuit in which all functional elements have a zero propogation delay.

Gated clock-signals and precharged structures have additional, more restrictive, timing requirements. For example, in the circuit in FIG. 1(b), the fact that the clock waveform seen by the latch B is no longer generated externally from the circuit implies that the delays of other components can cause desired data values to be overwritten because of logic "glitches" or logic-induced "skew" of the clocks. More specifically, proper timing of the circuit requires that the signal pass be able to propagate through D, before the rise of $\phi_0$. If pass has not propagated by this time, then the value of in might be unintentionally latched by B.

Similarly, since the outputs of precharged circuits like the one shown in FIG. 1(d) are "fragile" once the precharge phase is over, it is important that values completely propagate to inputs in1, in2, in3, and in4, before the evaluation phase begins. Otherwise, output might be unintentionally pulled down to LOW.

Precharged circuits like the one shown in FIG. 1(d) also have the additional constraint that the delay of the "pull-up" pFET 30 be such that output reaches the voltage HIGH before signal $\phi_0$ falls. A pFET may be described as a voltage controlled resistance that is $\infty$ when its gate input is HIGH, and some finite, nonzero value R when its gate input is LOW. The nonzero resistance R, coupled with the fact that any implementation of the circuit will have a nonzero capacitance on output, implies that there will be a delay between the start of the precharge phase and the time that output reaches HIGH. If this delay is longer than the length of the precharge phase, output will never reach the HIGH voltage. Similarly, there also exists a constraint that the evaluation phase be long enough to bring output to LOW.

Gate-clock signals and precharged structures introduce additional constraints that require the delays of some paths to be less than the time between the rising edge of some clock pulse, and the rising edge of some other clock pulse. In addition, precharged structures impose a constraint that the delays of components like the pFET 30 in the circuit shown in FIG. 1(d) be less than the amount of time between the rising edge of some clock pulse and the falling edge of the same clock pulse.

In order to simplify various timing-constraint formulations, the following description has been restricted to the special-case where level-clocked circuits utilize exactly two nonoverlapping clocks, as shown in FIG. 2. It will be understood by those skilled in the art that the invention is applicable to level-clocked circuits without the special case restraint.

Rather than treat the timing constraints of gated-clocks and precharged circuit structures on a case-by-case basis, they will be considered as special cases of a general timing constraint formulation. In all cases the constraints still take the form of inequalities between the delay of a path, and the length of some time interval which is bounded by a pair of clock edges. Since the determination of the propagation delay along a path can be treated as a separate problem, the only difficulty to be surmounted is the need to systematically identify the length of the appropriate time interval. This quantity is referred to as the temporal length of the path.

In the prior art, the following two assumptions are used to restrict the types of temporal lengths that need to be considered. First, for every circuit component, all latches from which the component can be reached via combinational paths must be controlled by the same clock $\phi$. The clock $\phi$ is the input phase or simply the phase of the component. Second, no latch-free paths exist between latches controlled by the same clock phase (i.e., latches along a path are controlled by alternating clock phases).

Given these assumptions, it is possible to associate with each component a unique clock waveform $\phi$ that controls all latches that can be reached from the component via a combinational path. The clock $\phi'$ is the output phase of the component. In addition, it is also possible to associate with each component a unique clock waveform $\phi$ that controls all the latches from which the component can be reached via a combinational path. The clock $\phi$ is the input phase of the component. Under these assumptions, the temporal length of a particular path is formulated as a function of the input phase of the first component on the path, the output phase of the last component on the path, and the number of latches along the path.

Neither assumption, however, necessarily hold for level-clocked circuits which contain gated clock signals and precharged circuit structures. For example, in the circuit in FIG. 1(d), the pFET 30 and nFET 28 can be viewed as latches, while the "wire" connected to output can be viewed as a component. It is thus apparent that the first assumption is violated by output while the second assumption is violated by the nFET 28 and the latch B.

In order to handle circuits that violate the first assumption generalized definitions of "input phase," and "output phase" are required. The input phase can be conceptualized as the clock events at which the output of the component would change if all propagation delays were zero. The output phase can be conceptualized as the clock transitions that new output values of the component must be ready by. Since these characterizations of "input phase" and "output phase" can be directly applied to multiple (and arbitrary) clock transitions, the following definitions result:

An input-phase of a component u is any clock transition at which the output of u would change if all propagation delays were zero. The set of all input phases of u is the input phase set $\uparrow\Phi_I(u)$ of u.

An output-phase of a component u is any clock transition before which new values on the inputs to u must propagate to the output of u. The set of all output phases of u is the output phase set $\uparrow\Phi_O(u)$ of u.

The rising edge of $\phi_0$, the falling edge of $\phi_0$, the rising edge of $\phi_1$, and the falling edge of $\phi_1$, are denoted as $\uparrow\phi_0$, $\downarrow\phi_0$, $\uparrow\phi_1$, and $\downarrow\phi_1$, respectively. In addition, it is assumed that input phase sets cannot include $\downarrow\phi_0$ or $\downarrow\phi_1$, though this assumption can be eliminated at the expense of some increase in the complexity of various definitions. In terms of the above definitions, the prior art assumed that phase sets are singletons, and the input phase set and output phase set of each component are non-intersecting.

In order to handle circuits that violate the second assumption, a notion of "temporal length" is introduced. Since the clocks controlling the latches along a path have, in previous retiming work, been assumed to alternate, the temporal length of a path could be formulated as a function of the input and output phase of the ends of the path, and the number of latches along the path. Such an approach is problematic in the case, for example, where components can have multiple input phases. Consider a single latch u that is clocked by $\phi_0$, and part of a path p. The temporal length of p is an the amount of time available for value changes to propagate along p. However, the time contribution of u to this available time varies depends on the input phase of the last component v before u (in p) whose input phase set is a singleton. For example, the contribution would be the width, $|\phi_0|$, of a $\phi_0$ pulse if the input phase of v were $\uparrow\phi_1$ (i.e., if the latch preceding u on the path p were clocked by $\phi_1$), and 0 if the input phase of v were $\uparrow\phi_0$ (i.e., if u were part of a "chain" of latches that were all clocked by $\phi_0$). Since an input phase set can contain both $\uparrow\phi_1$ and $\uparrow\phi_0$, both cases are simultaneously possible, and it is apparent that u can have multiple contributions associated with it.

In general, a path $p=u\rightarrow v$ has multiple temporal lengths; one for each combination of input phase of u and output phase of v. The different temporal lengths can be specified using the following co-recursive definitions.

For any path p, the $\uparrow\phi_i,\downarrow\phi_i$ temporal length $\tau_{52\ \phi_i\downarrow_{\phi^i}}(p)$ of p is $$\tau_{\uparrow\phi_i\downarrow\phi_i}(p) = \begin{cases} |\phi_i| & \text{if } p = v, \text{ and} \\ & \downarrow\phi_i \in \uparrow\Phi_O(v) \\ \tau_{\uparrow\phi_i\downarrow\phi_i}(u'\rightarrow v) & \text{if } p = u\rightarrow u'\rightarrow v, \\ & \uparrow\phi_i \in \uparrow\Phi_I(u) \text{ and} \\ & \uparrow\phi_i \in \uparrow\Phi_I(u'), \\ |\phi_i| + |\epsilon_i| + \tau_{\uparrow\phi_{i+1}\downarrow\phi_i}(u'\rightarrow v) & \text{if } p = u\rightarrow u'\rightarrow v, \\ & \uparrow\phi_i \in \uparrow\Phi_I(u) \text{ and} \\ & \uparrow\phi_i \notin \uparrow\Phi_I(u'), \\ \infty & \text{otherwise.} \end{cases} \quad (1)$$

The $\uparrow\phi_i,\downarrow\phi_j$ temporal length $\tau_{\uparrow\phi_i,\downarrow\phi_j}(p)$ of p, i≠j, is $$\tau_{\uparrow\phi_i,\downarrow\phi_j}(p) = \begin{cases} |\phi_i| + |\epsilon_i| + |\phi_j| & \text{if } p = v, \text{ and} \\ & \uparrow\phi_i \in \uparrow\Phi_O(v) \\ & \downarrow\phi_j \in \uparrow\Phi_O(v) \\ \tau_{\uparrow\phi_i,\downarrow\phi_j}(u' \to v) & \text{if } p = u \to u' \to v, \\ & \uparrow\phi_i \in \uparrow\Phi_I(u) \text{ and} \\ & \uparrow\phi_i \in \uparrow\Phi_I(u'), \\ |\phi_i| + |\epsilon_i| + \tau_{\uparrow\phi_i,\downarrow\phi_j}(u' \to v) & \text{if } p = u \to u' \to v, \\ & \uparrow\phi_i \in \uparrow\Phi_I(u) \text{ and} \\ & \uparrow\phi_i \notin \uparrow\Phi_I(u'), \\ \infty & \text{otherwise.} \end{cases} \quad (2)$$

The $\uparrow\phi_i,\uparrow\phi_j$ temporal length $\tau_{\uparrow\phi_i,\uparrow\phi_j}(p)$ of p is $$\tau_{\uparrow\phi_i,\uparrow\phi_j}(p) = \tau_{\uparrow\phi_i,\downarrow\phi_j}(p) - |\phi_j|. \quad (3)$$

In all equations, i,j∈{0, 1} and addition in subscripts is performed modulo-2.

All the additional timing constraints associated with gated clock signals and precharged circuit structures can be specified by adding additional phases to the phase sets of the appropriate circuit components. For each combination of path p=u→v, input phase $\uparrow\phi\in\uparrow\Phi_I(u)$, and output phase $\uparrow\phi'\in\uparrow\Phi_O(v)$, proper circuit timing requires that the timing constraint $$d(p) \leq \tau_{\uparrow\phi\uparrow\phi'}(p) \quad (4)$$

be satisfied. The quantity $\tau_{\uparrow\phi\uparrow\phi'}(p)-d(p)$ is the slack of a particular constraint.

The "retiming" of a component u is frequently conceptualized as the removal of one latch from each output from u and the insertion of one latch onto each input to u. The goal of the retiming is to increase the temporal length of paths that end at u, thereby relaxing the constraints on the total propagation delays along such paths. The notion of retiming by removing and adding latches cannot be directly applied to components like A in the circuit on FIG. 1(b) and the nFETs in FIG. 1(b), since in the former case, the latch B is not on the output of A in the normal sense, and in the later case, such manipulations do not consider the need to "choreograph" the precharge and evaluation phases of the precharged structure.

Retiming may be also be conceptualized in terms of "lag". The idea of lag is described, for example in an article by C. E. Leiserson et al, entitled "Retiming Synchronous Circuitry" in Algorithmica, 6(1), 1991. If it is assumed that logic blocks have propagation delays of zero, and the mapping, of input values of a component u to points in time are examined, it will be apparent that the functional affect of retiming it (removing and adding latches) is to "lag" the mapping, that is, every input transition that occurs at one rising clock edge now occurs at the next rising clock edge. For example, if a logic block u initially has an input phase of $\uparrow\phi_0$, then its input phase becomes $\uparrow\phi_1$, after the retiming, and all output value transitions of u are shifted forward in time by the width of a $\phi_0$ pulse plus the width of the "gap" between $\phi_0$ pulses and $\phi_1$ pulses (i.e., shifted forward to the following $\uparrow_{100\ 1}$). This lagging of inputs could be accomplished by simply adding latches to the inputs of u, but since the lagging of all inputs immediately implies the lagging of all outputs, it is also necessary to remove latches from the outputs of u, so that the lagged outputs eventually "catch up" with their original value-to-time mappings. If no latch is available on an output of u, then it is necessary to also retime the component v that the output goes to (so that the inputs to v are lagged, and thus can be directly connected to the lagged output of u).

Figure 3A:
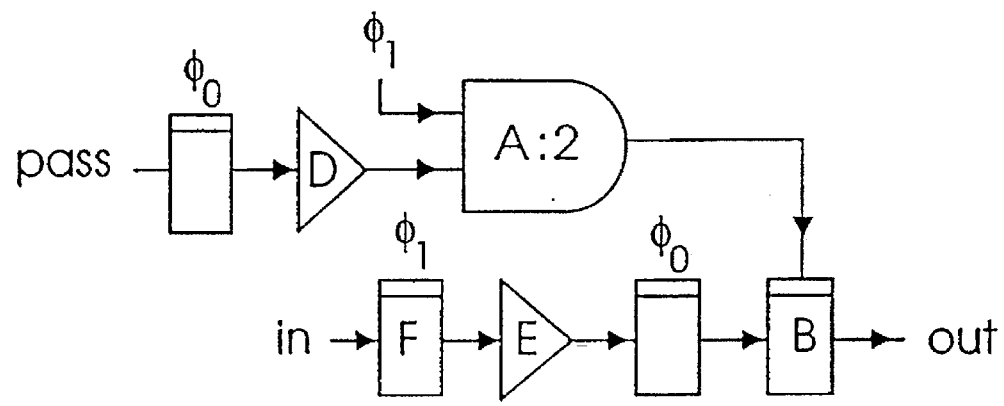
FIG. 3a is a schematic diagram of a retimed gated clock circuit.

This notion of "retiming" as the lagging of inputs is directly applicable to gated clock structures. Consider for example the component, D in FIG. 1(b). Lagging the input to D is a simple matter of placing a latch clocked by $\phi_0$ between pass and the input. Since there are no latches between D and A, the lagging of D implies the need to lag A. This can be accomplished since the input from D is already lagged, and the clock input can be lagged by changing the clock input from $\phi_0$ to $\phi_1$. Since both inputs have been lagged, it follows that the output of A will be lagged, which in turn implies the need to lag B. The clock input to B is already lagged, and thus presents no problem, while the other input from E can be lagged with the introduction of a latch clocked by $\phi_0$. No further lagging is needed, since the lag of the output of B can be compensated for by deleting the latch C. Retiming can thus be performed by using various methods to introduce lags. The final retiming circuit configuration of a gated clock circuit is shown in FIG. 3(a).

While it is apparent that lagging the inputs of A implies the need to lag the inputs to B, an issue arises when lagging the inputs to E. In particular, the lag could be accomplished by moving B from the output of E to the input of E. This has the desired effect, so long as the clock input to B remains the output of A. Alternatively, the lag could also be accomplished by introducing a latch clocked by $\phi_0$ on the input to E. Since this latter options lags the "data" input to B, it also becomes necessary to lag the clock input to B. Introducing a latch between A and B does not have the desired effect, however, the solution is simply to lag both inputs to A, i.e., change the clock input of A to $\phi_1$ and place a latch clocked by $\phi_0$ on the other input to A. For the following description, the latter option of lagging the inputs to B is assumed. This assumption implies that the number of times that A and B are lagged (i.e., retimed) must be equal.

Figure 3B:
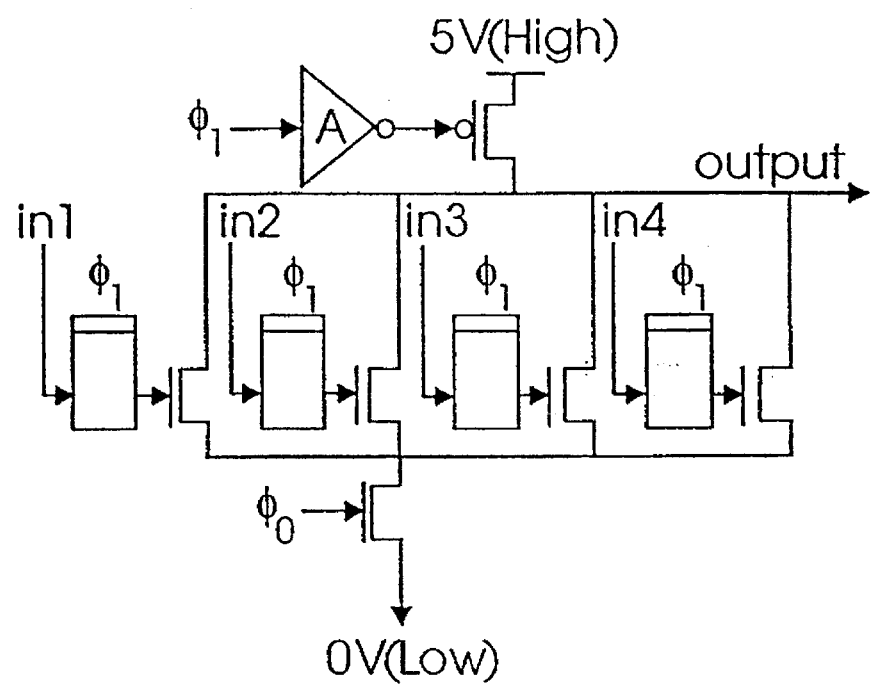
FIG. 3b is a schematic diagram of a retimed precharged circuit structure.

Similarly, the nFETs in FIG. 1(d) can be retimed. For example, lagging the in1 input to nFET 20 is accomplished by introducing an additional latch. Lagging the input from nFET 28 is accomplished by changing the clock input to the nFET from $\phi_1$ to $\phi_0$ (the Low voltage input to nFET 20 does not require lagging, since it has no transitions associated with it). The implied lag in the "output" of nFET 20 requires, that the signal output also be lagged. The lag can only be accomplished if the precharge and evaluation phases of the structure are preserved. This can be accomplished by lagging the inputs to the other nFETs 22, 24 26, and pFET 30 (note that the lagging of nFETs 22, 24, 26 is also mandated by the lagging of nFET 28). Finally, the lag of output is compensated for by removing the latch B. The final retiming circuit configuration of a precharged circuit structure is shown in FIG. 3(b). As in the gated-clock case, proper timing can be insured by requiring that various components be retimed equally.

Given the "lag" interpretation of retiming, the retiming of a pair of components u and v affects the timing constraint for a path between u and v in the following fashion. Let $\chi_0$, $\chi_1$, $\chi_2$ and $\chi_3$ denote $\uparrow\phi_0$, $\downarrow\phi_0$, $\uparrow\phi_1$, and $\downarrow\phi_1$, respectively. Moreover, let $\delta_i$ denote the length of time between $\chi_i$ and $\chi_{i+1}$, where all subscripts are modulo-4, and let r be a retiming function that indicates the number of times that u and v are to be lagged. For a path p and input-output phase combination $\chi_i$-$\chi_j$, retiming u and v result in the timing constraint $$\sum_{k=j-1}^{(j-1)+2r(v)} (\delta_k) - \delta_{j-1} + \tau_{\chi_i\chi_j}(p) - d(p) \geq \sum_{k=i-1}^{(i-1)+2r(u)} (\delta_k) - \delta_{i-1} \quad (5)$$

for any retiming function values r(u) and r(v), and where d(p) denotes the total propagation delay along p. The first two terms in the left-hand side are the amount of additional temporal "distance" due to the retiming of v, while the right-hand side of the inequality is the amount of temporal "distance" that is lost due to the retiming of u.

A formal statement of the retiming problem can be made as follows. Let a, level-clocked circuit be represented as a directed multi-graph G=(V,E,d,$\uparrow\Phi_I$,$\uparrow\Phi_O$), where the delay function d maps the elements of V to the nonnegative real numbers, the input phase function $\uparrow\Phi_I$ maps each element of V to an input phase set, and the output phase function $\uparrow\Phi_O$ maps each element of V to an output phase set. A vertex v∈V corresponds to an electrical node (i.e., wire) whose voltage is considered to be the "output" signal of some circuit structure, such as a combinational logic block, a level-clocked latch, tristate buffer, or even a single transistor. The set of edges E indicates not only the ability of the signal represented by vertex to directly affect the value of the signal represented by another vertex, but also the ability to lag some signal by lagging a set of other signals. More formally, the set of edges E is required to be such that for all v∈V, lagging all electrical nodes represented by u such that u→v∈E must result in the lagging of the electrical node represented by v. The retiming problem is to compute a retiming function r: V→Z, such that inequality 5 above is satisfied for all paths p in G, and input-output phase combinations $\chi_i$-$\chi_j$, and r(u)=r(v) for all u and v such that u→v∈E and a lagged version of the signal represented by u cannot be obtained with the introduction of a latch whose data input is u.

In order to obtain a practical algorithm for retiming a circuit with gated-clocks and precharged structures, it is necessary to identify "critical" paths in the circuit. Since the paths referred to in inequality 5 above are infinite in number, it is not possible to individually check all of them during the course of a practical retiming algorithm.

FIG. 4 illustrates a situation where the critical path, from X, for the retiming of Y could be anyone of four different paths. This is a worst-case situation if input phases are restricted to rising clock edges, and output phases are restricted to falling clock edges. Each path begins at X, goes through either A, B, C, or D, and ends at Y. For simplicity, the label of the middle component is used to refer to the entire path. For each possible combination of input-phase of X and output-phase of Y, the left-most four columns of the table in FIG. 4 show the slack value of each path. For example, the top-left-most table entry indicates that for inputs to X with an input-phase of ↑$\phi_0$ and outputs from Y that have an output-phase of ↓$\phi_1$, the path through A has a slack of 1. For each combination of input-phase and output-phase, the slack of the critical path amongst A, B, C, and D is bold-faced. Each path is critical for some input-output-phase combination. Moreover, each path is the absolute critical path (over all input-output-phase combinations) for some set of retiming values for X and Y. The right-most four columns of the table show the slacks for each path for some different possible retiming values. These slack values are for each path combined with the initial input-output-phase combination for which the path is critical. For example, path A is initially paired with the phase combination $\phi_0$—$\phi_0$, and has a slack of 1. If Y is retimed by 1, however, the output phase for this path becomes $\phi_1$, and the slack of the path becomes 3, as shown in the third column from the right.

A standard single-source, shortest-paths-type algorithm can be used to compute the critical paths for each pair of vertices u and v. Since single-source, shortest-paths algorithms generally simultaneously compute the shortest path between the chosen source and every possible destination a single run of such an algorithm can compute all the critical paths for a particular source u. The metric for the shortest-paths algorithm is essentially the incremental contribution that each vertex makes to the various temporal lengths of a path, minus the propagation delay of the vertex. Since the definitions of the temporal lengths are "cross coupled" it is convenient to compute multiple temporal lengths during the same run of the shortest-paths algorithm.

FIG. 5 shows an algorithm RETIME (G) for testing whether a circuit represented by a graph G can be retimed to meet the timing requirements of a given set of clock waveforms. The critical paths from each vertex to all other vertexes, can be computed with a single run of a shortest-paths algorithm. Assuming a Bellman-Ford-type algorithm, Step 1 can be completed in $O(V^2E)$ time. Given the critical constraints, the inequalities specified by inequality 5 above can be formed, and combined with the additional constraints that certain components must be retimed equally. The resulting set of retiming constraints can be shown to be $O(V^2)$ in size, as well as an instance of the integer monotonic programming (IMP) problem described in an article by A. T. Ishii, C. E. Leiserson and M. C. Papaefthymiou entitled "Optimizing two-phase, level-clocked circuitry in Advanced Research in VLSI and Parallel Systems: Proc. of the 1992 Brown/MIT Conference, MIT Press, pp. 245–265, March 1992 and appended hereto. As a consequence, the retiming constraints can be tested for feasibility in in $O(V^3)$-time using the methods described in Ishii et al. Since an algorithm analogous in function (and identical in running-time complexity) to RETIME is the main "subroutine" of algorithms and approximation schemes presented in the Ishii et al article, it is possible to obtain fully polynomial-time approximation schemes and algorithms for retiming level-clocked circuits that utilize gated clock signals and precharged structures.

The present invention describes methods for applying retiming techniques to level-clocked VLSI systems that incorporate gated clock signals and precharged circuit structures. Previous methods for retiming level-clocked circuits have not been directly applicable to such circuit structures. In addition, many "high-performance" VLSI systems, such as microprocessors also make extensive use of gated clocks and precharging, and thus, the methods presented herein not only enable retiming techniques to be applied, for the first time, to the most common types of actual level-clocked circuit, s, but also to a variety of important "full custom" VLSI designs.

While gate&clocks and precharged circuit structures are examples of the kinds of circuit structures that are addressed, the invention is equally applicable to any circuit structure that, meets the basic requirements that (1) the input and output phases are clock edges, and (2) lagging the output of the structure can be accomplished by lagging all the outputs of some appropriate set of circuit components.

While there has been described and illustrated methods of retiming level-clocked circuits, it will be apparent to those skilled in the art that variations and modifications are possible without deviation from the broad principles and spirit of the present invention which should be limited solely by the scope of the claims appended hereto.

What is claimed is:

1. A method of designing a VLSI system including precharged circuit structures by virtue of gated clock signals and having a set of timing constraints, comprising the steps of:

determining critical elements of the set of timing constraints;

formulating sets of inequalities between the delay of a path and the temporal length of a critical path bounded by a pair of clock edges based upon said critical elements;

selecting clock signals for use in the delay path for a set of inequalities, which clock signals retime the VLS1 system without changing the input/output behavior of the system; and designing said system based on said selected clock signals.

2. A method of designing a VLSI system as set forth in claim 1, wherein said selecting clock signals comprises selecting alternatively available clock signals.

3. A method of designing a VLSI system as set forth in claim 1, wherein said selecting clock signals comprises selecting a new generated clock signal.

4. A method of designing a VLSI system as set forth in claim 1, further comprising determining critical timing constraints for each clock signal.

5. A method of designing a VLSI system as set forth in claim 1, wherein said timing constraints are $d(p) \leq \tau_{\uparrow\Phi\uparrow\Phi'}(p)$ where $p=u \rightarrow v$, $d(p)$ is the total propagation delay along p, $\uparrow\Phi$ is an input phase of u, $\uparrow\Phi'$ is an output phase of v and $\tau_{\uparrow\Phi\uparrow\Phi'}(p)$ is the $\uparrow\Phi\uparrow\Phi'$ temporal length of p.

6. A method of designing a VLSI system having a level-clocked circuit represented as a directed multi-graph $G=(V,E,d,\uparrow\Phi_I,\uparrow\Phi_O)$, where delay function d maps the element of V to nonnegative real numbers, the input phase function $\uparrow\Phi_I$ maps each element V to an output phase set, and the output phase function $\uparrow\Phi_O$ maps each element of V to an output phase set and E is a set of edges, comprising the steps of:

computing a retiming function r: $V \rightarrow Z$, where V is the set of components and Z is the of integers such that for path p and input-output phase combination $\chi_i$-$\chi_j$;

$$\sum_{k=j-1}^{(j-1)+2r(v)} (\delta_k) - \delta_j - 1 + \tau_{\chi_i\chi_j}(p) - d(p)$$

$$\sum_{k=i-1}^{(i-1)+2r(u)} (\delta_k) - \delta_i - 1$$

where ($\delta$) is the length of time between $\chi_k$ and $\chi_{k+1}$ and the subscript is modulo-4 and $\chi_0$, $\chi_1$, $\chi_2$ and $\chi_3$ denote rising edge of clock $\phi_O$, the falling edge of clock $\phi_O$, the rising edge of clock $\phi_1$, and the falling edge of clock $\phi_1$ respectively, $\tau_{\chi_i\chi_i}(p)$ is the temporal length and d(p) is the propagation delay along path p, and retiming function values r(u)=r(v) for all components v and components u such that $(u \rightarrow v) \in E$ and a lagged version of the signal represented by u cannot be obtained with the introduction of a latch whose data input is u;

lagging u and v by selecting input phase functions and output phase functions for retiming the VLSI system according to the calculated retiming function values; and designing said systems based upon said lagging.

7. A method as set forth in claim 6, wherein said input phase and said output phase are clock edges.

8. A method as set forth in claim 7, wherein said lagging comprises selecting a clock signal.

9. A method as set forth in claim 7, wherein said lagging comprises selecting a newly generated clock signal.

10. A method of designing a VLSI system, the system having multiple components, each component having input phases and output phases, comprising the steps of:

(a) computing a critical path for each pair of components and each pair of input phases and output phases for the pair of components;

(b) selecting for each pair of components a most critical path;

(c) if the most critical path is not properly timed, retime one component of the pair of components by use of a selected input phase or output phase to properly time the path;

(d) if the most critical path is properly timed or after step (c), repeat steps (b) and (c) until each most critical path between each pair of components is properly timed; and (e) designing said system based on said each most critical path being properly timed.

11. A method of a VLSI system containing components having multiple input phases and/or multiple output phases and multiple temporal lengths for each combination of input phase and output phase comprising the steps of:

computing critical paths between a predetermined input phase and each output phase, where said input phase and said output phase are clock edges;

determining the shortest critical path computed;

calculating retiming functions values r(u) and r(v) for the shortest critical path;

lagging u and v the quantity of times determined by said retiming function values by selecting input phases and output phases in the shortest critical path, where u and v are components of the VLSI system; and designing said system based on said lagging.

12. A method of designing a VLSI system as set forth in claim 11 where said lagging comprises changing a clock input.

13. A method of designing a VLSI system as set forth in claim 11 where said lagging comprises using a new clock input.

14. A method of designing a VLSI system as set forth in claim 11, wherein said lagging comprises lagging all of the outputs of selected components of the VLSI system.

15. A method of designing a VLSI system as set forth in claim 11, wherein said lagging comprises selecting a clock signal.

16. A method of designing a VLSI system as set forth in claim 11, wherein said lagging comprises selecting a newly-generated clock signal.

* * * * *